(12) United States Patent
Kuriyama et al.

(10) Patent No.: US 6,205,045 B1
(45) Date of Patent: Mar. 20, 2001

(54) SEMICONDUCTOR MEMORY DEVICE HAVING IMPROVED CELL ARRAY LAYOUT

(75) Inventors: Masao Kuriyama, Fujisawa; Shigeru Atsumi, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/544,293

(22) Filed: Apr. 6, 2000

Related U.S. Application Data

(62) Division of application No. 09/030,997, filed on Feb. 26, 1998, now Pat. No. 6,064,618.

(30) Foreign Application Priority Data

Feb. 27, 1997 (JP) .................................................. 9-044373

(51) Int. Cl.⁷ .................................................. G11C 5/06
(52) U.S. Cl. ........................................ 365/63; 365/230.03
(58) Field of Search ................................... 365/230.03, 63

(56) References Cited

U.S. PATENT DOCUMENTS

| 5,410,680 | * | 4/1995 | Challa et al. .................. 395/500 |
| 5,659,513 | | 8/1997 | Hirose et al. .................. 365/205 |
| 5,838,627 | | 11/1998 | Tomishima et al. ............ 365/51 |

* cited by examiner

*Primary Examiner*—David Nelms
*Assistant Examiner*—M. Tran
(74) *Attorney, Agent, or Firm*—Banner & Witcoff, Ltd.

(57) ABSTRACT

Each of first and second cell array groups has a cell array and a row decoder. Circuit blocks including a reset transistor, a Y selector, a write transistor, a block decoder, and a source decoder except the cell array and row decoder are arranged in the area between the first and second cell array groups. Since an address signal, a control signal, and a power supply common to the circuit blocks can be shared, the layout area can be reduced.

13 Claims, 16 Drawing Sheets

SEMICONDUCTOR MEMORY DEVICE HAVING IMPROVED CELL ARRAY LAYOUT

This application is a divisional of prior application Ser. No. 09/030,997 filed Feb. 26, 1998, now U.S. Pat. No. 6,064,618.

BACKGROUND OF THE INVENTION

The present invention relates to a semiconductor memory device and, more particularly, to its cell array layout.

A semiconductor device is manufactured by forming a number of chips on a wafer by lithography. In this process, the chip area determines the number of chips available from one wafer. That is, the cost of the semiconductor memory device largely depends on the chip area. Especially, most of a semiconductor memory device is occupied by a memory cell array, and its decoders and peripheral circuits. Efficient layout of the memory cell array is the most important factor in determining the manufacturing cost of the memory.

Conventionally, the wiring of the memory is formed by one metal interconnection layer and one or several polysilicon interconnection layers. Therefore, the arrangement and interconnections of the core portion including memory cells and decoders are optimized on the assumption of the single metal layer. In recent years, two or more metal interconnection layers have come to be used even in a memory. However, the arrangement and interconnections of the core portion remain almost the same as those of the conventional structure using one metal layer, so the manufacturing cost of the memory has not lowered significantly. For this reason, demand has arisen for reducing the layout area of the core portion by using a multilevel metal interconnection independently of the conventional layout.

The layout of a core unit using a single metal interconnection and that using a multilevel metal interconnection will be described below while simplifying a conventional nonvolatile semiconductor memory device, e.g., a flash EEPROM (Electrically Erasable Programmable ROM).

FIG. 9 shows the schematic arrangement of the core portion using a single metal interconnection. In FIG. 9, the core portion of the nonvolatile semiconductor memory device comprises a memory cell array 90a, a row decoder 90b, a Y selector 90c, a reset transistor 90d, a write transistor 90e, a source decoder SOD (L/D: Load/Driver) 90f, an SOD (CONT: control) 90g, and a block decoder BLD 90h. The memory cell array 90a comprises, e.g., NOR EEPROM cells. The row decoder 90b selects the word lines of desired memory cells. The Y selector 90c selects bit lines in accordance with a column selection signal supplied from a column decoder (not shown). The reset transistor 90d resets the bit lines to the ground potential in the standby state or upon completing the program. The write transistor 90e applies a high voltage to the bit lines of desired memory cells in a write. The source decoder SOD (L/D) 90f applies a source potential to the memory cells through a source line SL. The SOD (CONT) 90g controls the source decoder SOD (L/D). The block decoder BLD 90h selects a desired cell array block.

In the case of the single metal interconnection, these circuits has configurations as shown in FIG. 10. FIG. 10 shows a plurality of cell array blocks, and the same reference numerals as in FIG. 9 denote the same parts in FIG. 10. In this case, a data line 100 and a control signal line 101 of the write transistors (write Tr) 90e constituted by a plurality of signals are shared, so two cell arrays 90a are laid out symmetrically about the data line 100 and the control signal line 101.

The Y selector 90c connected to the data line 100 and the write transistor 90e are inserted between the memory cell array 90a, on the one hand, and the data line 100 and control signal line 101, on the other hand. When the Y selector 90c and the write transistor 90e are located at the central portion of the chip, the remaining signal lines and-cell source lines can hardly be arranged at the central portion by the single metal interconnection. Especially, since the source decoder (SOD (L/D)) 90f applies the source potential to the cells, this interconnection must have a low resistance. Inevitably, the source decoders 90f and 90g are disposed on the opposite side of the Y selector 90c with respect to the cell array 90a. The reset transistor (reset Tr) 90d is also located on the upper or lower side of the cell array 90a in FIG. 10 in consideration of easy arrangement of signal and ground (GND) interconnections.

The layout of the core portion using the conventional multilevel metal interconnection will be described next with reference to FIG. 11.

In case of the multilevel metal interconnection, to lower the resistance of the word lines in the core portion, the block is divided. For this purpose, a double word line scheme is used.

For example, 8 to 16 word lines are selected by a row global decoder (RGD) 111a. The output from the row global decoder 111a is connected to a second level metal interconnection (2Al) 111c and formed on the cell array. Each block has a row local decoder (RLD) 111b having a plurality of NAND circuits. The row local decoder (RLD) 111b selects one word line WL in accordance with the output signal from a row partial decoder (RPD) hid through-the first level metal interconnection (1Al) and the output signal from the row global decoder 111a.

The Y selector, the reset transistor, the write transistor, the source decoder SOD (L/D), the SOD (CONT), and the block decoder BLD are located on the upper or lower side of the cell array in FIG. 11, as in the above-described core portion using the first level metal interconnection (1Al).

The address signal and control signal lines of each circuit are arranged on each circuit block using the second level metal interconnection to reduce the layout area.

When the circuit blocks are laid out in the periphery of the cell array, the space cannot be efficiently used because of the following problems.

(1) Since the circuit blocks and cell array are symmetrical about the data line, power supply interconnections including a ground interconnection GND and a power supply interconnection Vdd must be formed on both the upper and lower sides of the cell array, resulting in an increase in layout area.

(2) Since the circuit blocks are arranged on the upper and lower sides of the cell array, wiring for an address and control signal common to a plurality of circuit blocks must be formed on both upper and lower sides of the cell array, resulting in an increase in layout area.

(3) Since the circuit blocks are present on the upper and lower sides of the cell array, even substrate and well potential circuits common to a plurality of circuit blocks must be laid out on both the upper and lower sides of the cell array, resulting in an increase in wasteful layout area at the boundary between the substrate and well.

The prior art and its problems in layout of a core portion having blocks with irregular shapes and sizes and the layout of peripheral circuits will be described while exemplifying a nonvolatile semiconductor memory device, e.g., a flash EEPROM.

The memory cell array of the flash EEPROM is broken up into several units (blocks), and data is erased in units of blocks. The flash EEPROM also has a function of enabling or inhibiting writes/erases in/from cells in units of blocks. Normally, the blocks are formed by regularly dividing the cell array. For example, an 8 Mbit cell array is divided into 16 512-Kbit (64 KB) blocks.

The cell array is sometimes irregularly divided to form blocks. For example, an 8 Mbit cell array is broken up into 15×512 Kbit (64 KB)+1×256 Kbit (32 KB)+1×128 Kbit (16 KB)+2×64 Kbit (8 KB) blocks. In this case, the larger number of 512 Kbit (64 KB) blocks are called regular blocks, and the remaining 64 to 256 Kbit blocks are called irregular blocks. The user can write, e.g., fixed data of a peripheral device in this irregular block in accordance with the application purpose.

The cell array having irregular blocks has some unsolved problems of layout, unlike the completely regularly divided cell array.

FIGS. 12 and 13 show the schematic arrangement of a cell array having regular blocks and irregular blocks.

A regular block BLK (0) is divided in units of columns in correspondence with each I/O. Columns COL (0) to (31) corresponding to an I/O (0) (not shown) are connected to a data line DL (0) through a Y selector. Columns COL (32) to (63) are connected to a data line DL (1) through the Y selector. The Y selector is controlled by column selection signals Hi and Di and a block selection signal BLK (i).

Since the columns COL (0) to (31) are adjacent to each other, transistors forming the Y selector are put into a group. The data lines DL (i) are commonly arranged for blocks.

An irregular block BLK (1) is divided in units of columns in correspondence with each I/O, like the regular block. However, the number of columns connected to one I/O changes depending on the block size. In a 64 Kbit block, four columns are connected to one I/O. In a 128 Kbit block, 8 columns are connected to one I/O. In a 256 Kbit block, 16 columns are connected to one I/O (these arrangements correspond to a block with 1,024 rows).

When regular and irregular blocks are to be selected by the same column selection signals Hi and Di and block selection signal BLKi, subdata lines (SDL (0), SDL (1), . . .) stretching across a plurality of irregular blocks are required, as shown in FIG. 13, resulting in an increase in area.

FIG. 14 shows the schematic layout of a core portion having conventional regular blocks and irregular blocks. In an irregular block portion 140a, subdata lines 143 are arranged between a Y selector 141, to which the column selection signals Hi and Di are supplied, and a block selector 142. The size of the core portion increases because of the subdata lines 143. On the other hand, a regular block portion 140b does not need this subdata line area. Most of the area of data lines 144 at the core center corresponds to the regular block portion 140b, so a large free area 145 forms in correspondence with the regular block portion 140b. Therefore, the chip size increases by the free area 145, resulting in high cost.

A conventional layout of peripheral circuits and its problems will be described next.

FIG. 15 shows the conventional layout of a flash EEPROM. Input/output pads are arranged at the peripheral portion of a chip 151. More specifically, I/O pads 152 of the input/output system are formed on the lower side of the chip 151 in FIG. 15, and pads 153 for address signal/control signal systems are mainly formed on the upper side.

A plurality of peripheral circuits 154 for processing input address signals or control signals are arranged near the pads 153. These peripheral circuits 154 include an address buffer, a control buffer, and a redundancy circuit (none are shown). A plurality of peripheral circuits 155 for processing input/output data Din/Dout are provided near the I/O pads 152. These peripheral circuits 155 include an output buffer, an input buffer, a command processing circuit, and an automatic control circuit that operates upon receiving an input command (none are shown). A plurality of pads 156 of the power supply system (Vdd/Vss) are formed to be adjacent to the I/O pads 152. A plurality of peripheral circuits 157 of the power supply system are disposed near the power supply pads 156. These peripheral circuits 157 include a charge pump circuit (C.P) and a power control circuit.

In the above-described conventional chip layout, a plurality of peripheral circuits are distributed to the two end portions along the longitudinal direction of the chip. For this reason, the area where the peripheral circuits 154, 155, and 157 are located has a rectangular shape along the direction of pad arrangement. Since the peripheral circuits 154, 155, and 157 are elongated along the short sides of the chip, a plurality of interconnections 158 formed between the peripheral circuits 154, 155, and 157 become long along the short sides of the chip, so the interconnection area and interconnection resistance and, more particularly, the resistance of power supply interconnections increase.

Since the peripheral circuits 154 and 155 are allotted to the two end portions along the longitudinal direction of the chip, signal transmission/reception between these peripheral circuits increases, so the interconnection area for connecting these peripheral circuits 154 and 155 also increases. Additionally, since the peripheral circuits 157 of the power supply system also have a rectangular shape, like the remaining peripheral circuits, the charge pump circuit (C.P) having a large area in the power supply circuits is also arranged along the short sides of the chip. In this arrangement, the power supply interconnection of the charge pump circuit which provides a large current cannot be widened, and noise is generated in the chip. Furthermore, the arrangement of a capacitor having a large area in the charge pump circuit is also restricted.

As described above, in the conventional semiconductor memory device, the power supply interconnection or signal interconnection can hardly be shared by blocks; a wasteful free space is generated, and the chip area is difficult to sufficiently reduce.

In the chip having irregular blocks, subdata lines are laid out in correspondence with irregular block portions, and free space is generated due to the subdata lines. For this reason, it is difficult to sufficiently reduce the chip area.

In addition, since the peripheral circuits are distributed to the two end portions along the longitudinal direction of the chip, the interconnection area for connecting the peripheral circuits increases. The peripheral circuits having difference functions must be crammed in small rectangular areas. For this reason, the layout of elements making up a peripheral circuit is restricted. Furthermore, since the interconnection must be interposed between the peripheral circuits, the width of interconnection cannot be increased.

BRIEF SUMMARY OF THE INVENTION

The present invention has been made to solve the above problems and has as its object to provide a semiconductor memory device which can sufficiently reduce the chip area and efficiently arrange peripheral circuits by removing any wasteful free space.

In order to achieve the above object of the present invention, according to an aspect of the present invention, there is provided a semiconductor memory device having a core portion including a cell array comprising: a first cell array group arranged in the core portion and including a plurality of cell arrays and a row decoder; and a second cell array group arranged substantially parallel to the first cell array group and including a plurality of cell arrays and a row decoder, wherein all circuit blocks in the core portion except the row decoders and the cell arrays are laid out in an area between the first and second cell array groups.

According to another aspect of the present invention, there is provided a semiconductor memory device based on a double word line scheme, comprising: a first cell array group including a plurality of cell arrays, a row local decoder for selecting word lines of the cell arrays, and a row global decoder for selecting the row local decoder; a second cell array group including a plurality of cell arrays, a row local decoder for selecting word lines of the cell arrays, and a row global decoder for selecting the row local decoder; and circuit blocks arranged in an area between the first and second cell array groups and including a row partial decoder for outputting a selection signal to be supplied to the row local decoder.

According to still another aspect of the present invention, there is provided a semiconductor memory device comprising: a first cell array including large regular blocks; a second cell array including irregular blocks each smaller than the regular block; a Y selector constituted by a block selector for selecting blocks of the first and second cell arrays and a column selector for selecting columns in the blocks; data lines extending along the regular blocks and adapted to connect columns selected by the Y selector to a sense amplifier; and subdata lines arranged on extended lines of the data lines along the irregular blocks, connected to the selected columns through the column selector, and connected to the data lines through the block selector; wherein the regular blocks are arranged near the sense amplifier, and the irregular blocks are laid out in a distant area from the sense amplifier.

According to still another aspect of the present invention, there is provided a semiconductor memory device, such as a chip, having a core portion including a cell array comprising: input pads, output pads, and peripheral circuits, which are arranged near the core portion, wherein peripheral circuits except the input pads, input circuits connected to the input pads, the output pads, and output circuits connected to the output pads are arranged on one portion of the chip.

According to the present invention, circuits except the cell array and the row decoder, and in case of the double word line scheme, circuits other than the cell array, the row global decoder, and the row local decoder are laid out in the area between the first cell array group and the second cell array group. Since the power supply can be shared by circuit blocks, the layout area can be reduced. In addition, since an address signal and a control signal common to the circuit blocks can be shared, the layout area can be further reduced. Furthermore, the layout area can also be reduced by forming the substrate potential and well potential circuits common to the circuit blocks in one area.

In the semiconductor memory device having irregular blocks, the irregular blocks are assigned an area farthest from the sense amplifier. With this arrangement, the data lines and subdata lines can be prevented from being parallel to each other. Since any wasteful free space can be prevented, the layout area of the core portion can be reduced.

When all peripheral circuits except the input buffer and output buffer are concentrated on one portion of the chip, the peripheral circuits can be efficiently laid out, and hence the layout area can be largely reduced.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the accompanying drawings.

Figure 1:
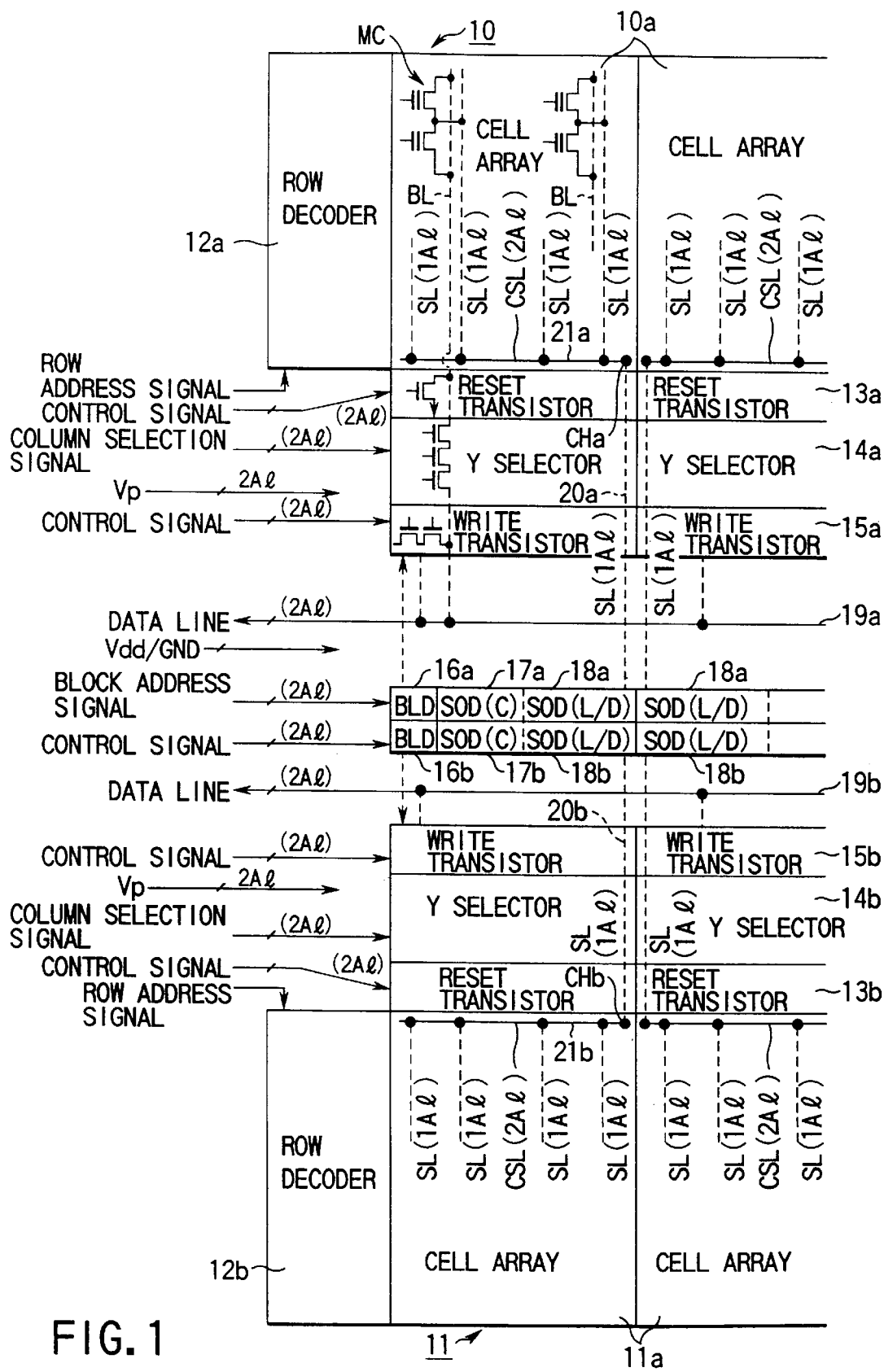
FIG. 1 is a circuit diagram showing the first embodiment of the present invention.

FIG. 1 shows the arrangement of the core portion of, e.g., a nonvolatile semiconductor memory device according to the first embodiment of the present invention. In this embodiment, a first cell array group 10 has a plurality of cell arrays 10a, and a second cell array group 11 has a plurality of cell arrays 11a. The first and second cell array groups 10 and 11 extend parallel to each other. Each of the cell arrays 10a, 11a comprises, e.g., a NOR EEPROM cell MC. However, the cell array arrangement is not limited to this, and other nonvolatile semiconductor memory devices can be applied. The first cell array group 10 has a first row decoder 12a, and the second cell array group 11 has a second row decoder 12b. A reset transistor (Tr) 13a for resetting corresponding bit lines is arranged for each cell array 10a of the first cell array group 10 in the area between the first and second cell array groups 10 and 11. A Y selector 14a for selecting corresponding bit lines is arranged in correspondence with each reset transistor 13a. A write transistor (Tr) 15a is arranged in correspondence with each Y selector 14a. This write transistor 15a applies a high voltage to corresponding bit lines in a data write. In addition, a block decoder (BLD) 16a, a source decoder (SOD (C)) 17a, and a source decoder (SOD (L/D)) 18a are provided in correspondence with each cell array 10a.

A reset transistor (Tr) 13b is arranged for each cell array 11a of the second cell array group 11 in the area between the first and second cell array groups 10 and 11. A Y selector 14b is arranged in correspondence with each reset transistor 13b. A write transistor (Tr) 15b is arranged in correspondence with each Y selector 14b. In addition, a block decoder (BLD) 16b, a source decoder (SOD (C)) 17b, and a source decoder (SOD (L/D)) 18b are disposed in correspondence with each cell array 11a.

In this layout, the reset transistors 13a and 13b are connected to bit lines BL and therefore laid out closer to the cell arrays than the the Y selectors 14a and 14b respectively. The write transistors 15a and 15b are connected to data lines 19a and 19b and hence laid out farther from the cell arrays 10a and 11a than the Y selectors 14a and 14b, respectively. Row address signals, control signals, column selection signals, data line potentials, block address signals, and a power supply Vp, and Vdd/GND for controlling these circuits are supplied through a second level metal interconnection (2Al) formed above the reset transistors 13a and 13b, the Y selectors 14a and 14b, the write transistors 15a and 15b, and the block decoders BLD 16a and 16b. The data lines 19a and 19b are located to be farther from the cell arrays 10a and 11a than interconnections for control signals supplied to the write transistors 15a and 15b, respectively. The broken lines in FIG. 1 indicate first level metal interconnections (1Al), and the solid lines indicate second level metal interconnections (2Al).

The output signals from the block decoders BLD 16a and 16b are supplied to the Y selectors 14a and 14b through the first level metal interconnections (1Al) (not shown). The output signals from the source decoders SOD (L/D) 18a and 18b are transferred to the cell arrays 10a and 11a through first level metal interconnections 20a and 20b, respectively. The first level metal interconnections 20a and 20b occupy the spaces among the write transistors 15a and 15b, the Y selectors 14a and 14b, and the reset transistors 13a and 13b included for the cell arrays 10a and 11a of the first and second cell array groups 10 and 11, i.e., the connection portions between cell array blocks, respectively. The first level metal interconnections 20a and 20b are connected to common source lines (CSL) constituted by second level metal interconnections (2Al) 21a and 21b at connection nodes CHa and CHb and connected to source lines SL of the cell arrays 10a and 11a through these common source lines CSL, respectively. Each source line SL is constituted by the first level metal interconnection (1Al).

Figure 16:
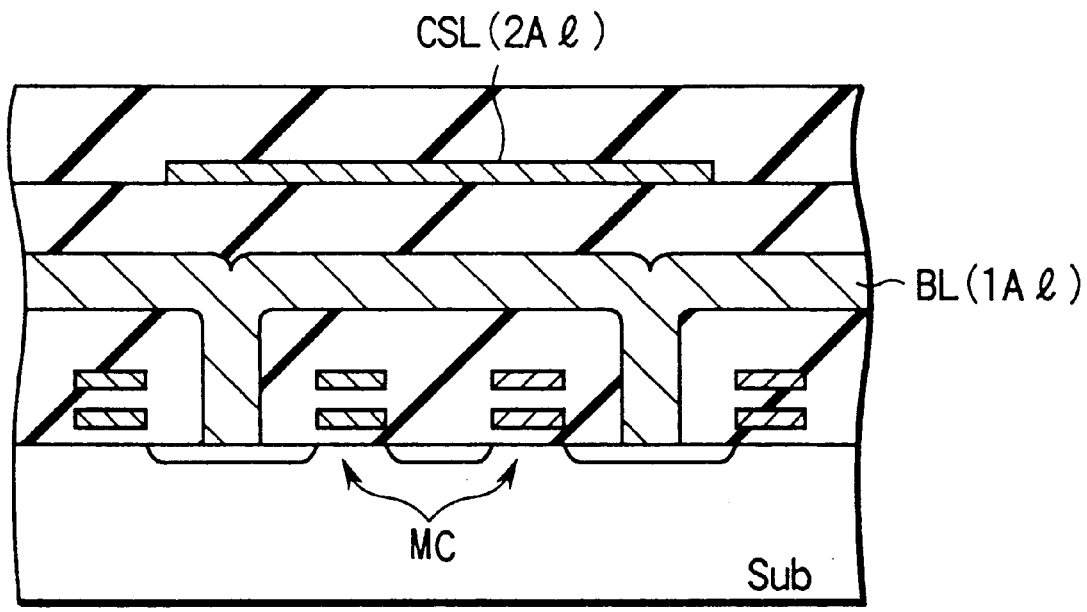
FIG. 16 is a sectional view showing the relationship among memory cells MC, bit lines BL and common source lines CSL shown in FIG. 1.
Figure 17:
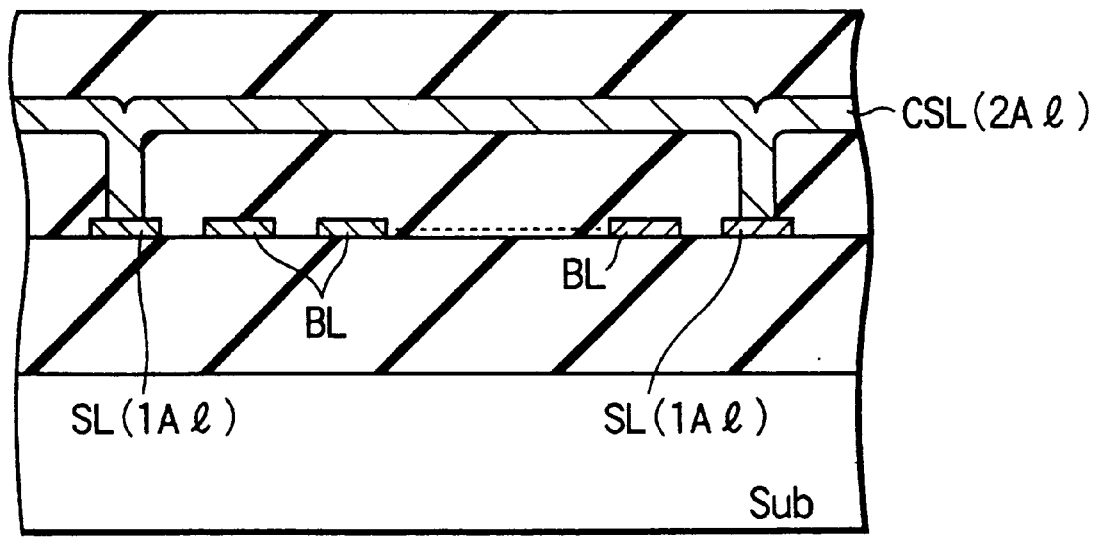
FIG. 17 is a sectional view showing the relationship among the bit lines BL, source lines SL, and the common source lines CSL shown in FIG. 1.

FIG. 16 shows the relationship among the memory cells MC, the bit lines BL, and the common source lines CSL shown in FIG. 1. FIG. 17 shows the relationship among the bit lines BL, and source lines SL, and the common source lines CSL shown in FIG. 1. As shown in FIG. 16, the common source lines CSL constituted by the second level metal interconnections 21a and 21b connecting the source lines SL in the cell arrays 10a and 11a extend in a wide area positioned above the first level metal interconnections via an insulating layer. Since the common source lines CSL can be made wide, power can be supplied with a low resistance.

As shown in FIG. 1, the block address signals, the power supply Vp, and Vdd/GND are supplied through the second level metal interconnections (2Al) formed above the block decoders BLD 16a and 16b, and the source decoders 17a, 17b, 18a, and 18b, so the layout area can be reduced.

With the circuit arrangement and signal line layout of this embodiment, all circuits of the core portion except the cell arrays 10a and 11a and the row decoders 12a and 12b can be concentrated in the area between the first and second cell array groups 10 and 11.

Figure 2:
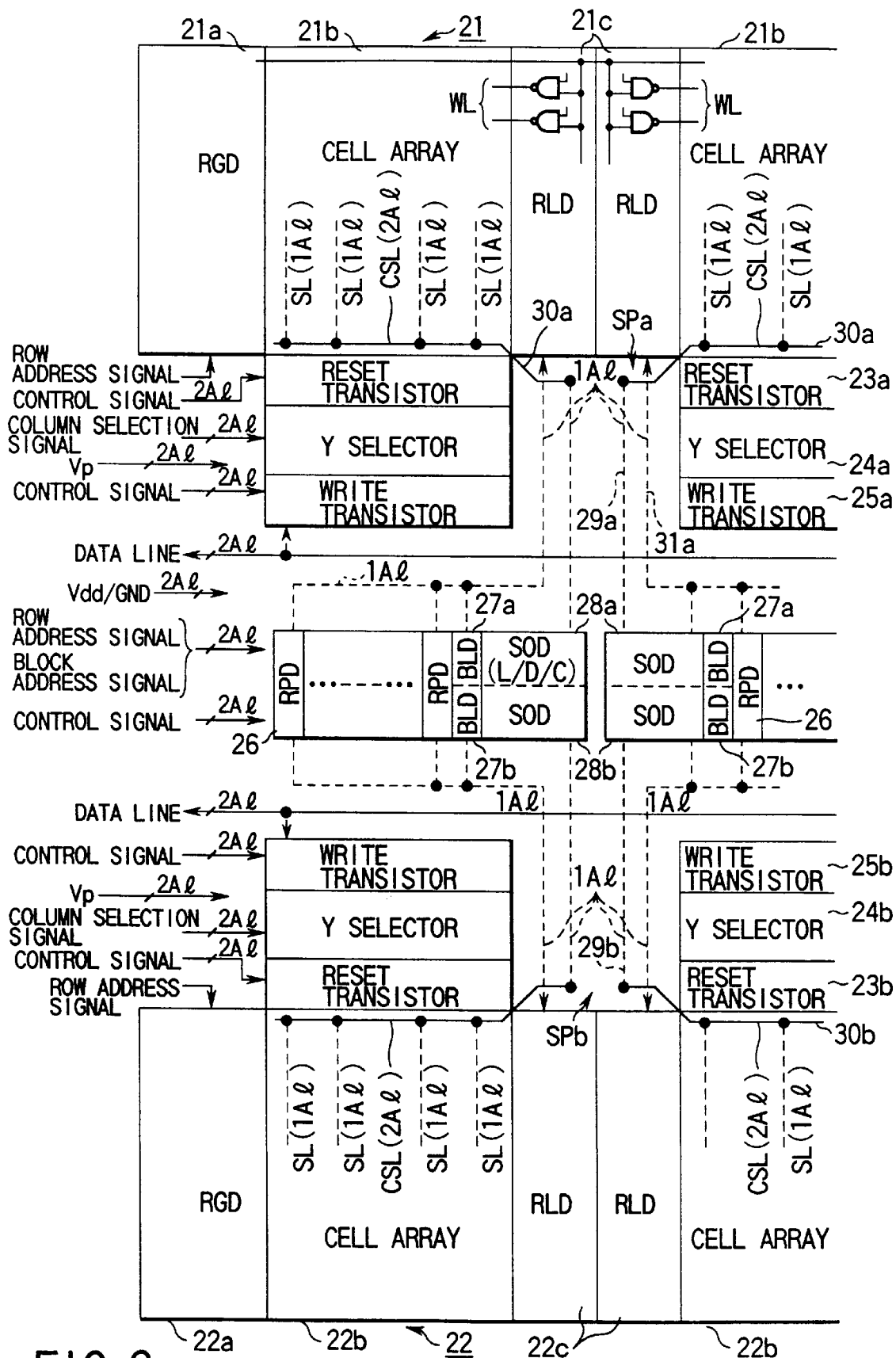
FIG. 2 is a circuit diagram showing the second embodiment of the present invention.

FIG. 2 shows the layout of a core portion of the second embodiment based on a double word line scheme. The arrangement in a cell array is almost the same as in the first embodiment in FIG. 1.

A first cell array group 21 is constituted by a row global decoder (RGD) 21a, a plurality of cell arrays 21b, and a plurality of row local decoders (RLD) 21c. A second cell array group 22 is constituted by a row global decoder 22a, a plurality of cell arrays 22b, and a plurality of row local decoders 22c. The cell arrays 21b and 22b have reset transistors (Tr) 23a and 23b, Y selectors 24a and 24b, and write transistors (Tr) 25a and 25b, respectively. Row partial decoders (RPD) 26 for partially decoding a row address, block decoders 27a and 27b, and source decoders (SPD (L/D/C)) 28a and 28b are provided in the area between the write transistor 25a of the first cell array group 21 and the write transistor 25b of the second cell array group 22.

The output signal from the source decoder 28a is supplied to the cell array 21b through a first level metal interconnection 29a formed in a space SPa formed by the row local decoders 21c, the reset transistor 23a, the Y selector 24a, and the write transistor 25a. The first level metal interconnection 29a is connected to source lines SL constituted by the first level metal interconnections through a common source line CSL constituted by a second level metal interconnection 30a. The output signals from the row partial decoders 26 and the block decoder 27a are supplied to the row local decoder 21c through a first level metal interconnection 31a like the interconnection 29a. The local decoder 21c selects one word line in accordance with the output signals from the row global-decoder 21a and the row partial decoder 26. More specifically, the row global decoder selects a row local decoder in accordance with a row address signal, and the row local decoder selects a word line of the cell array.

The above arrangement on the first cell array group 21 side also applies to the second cell array group 22 side. More specifically, the output signal from the source decoder 28b is supplied to the cell array 22b through a first level metal interconnection 29b formed in a space SPb formed by the row local decoder 22c, the reset transistor 23b, the Y selector 24b, and the write transistor 25b.

Control signals for various circuits, column selection signals, a power supply, and data line potentials are supplied to predetermined circuits through second level metal interconnections formed above the circuits, as in the first embodiment. Therefore, the layout area can be reduced, as in the first embodiment.

According to the second embodiment, all circuits of the core portion except the cell arrays, the row global decoders, and the row local decoders can be concentrated in the area between the cell arrays.

Figure 3:
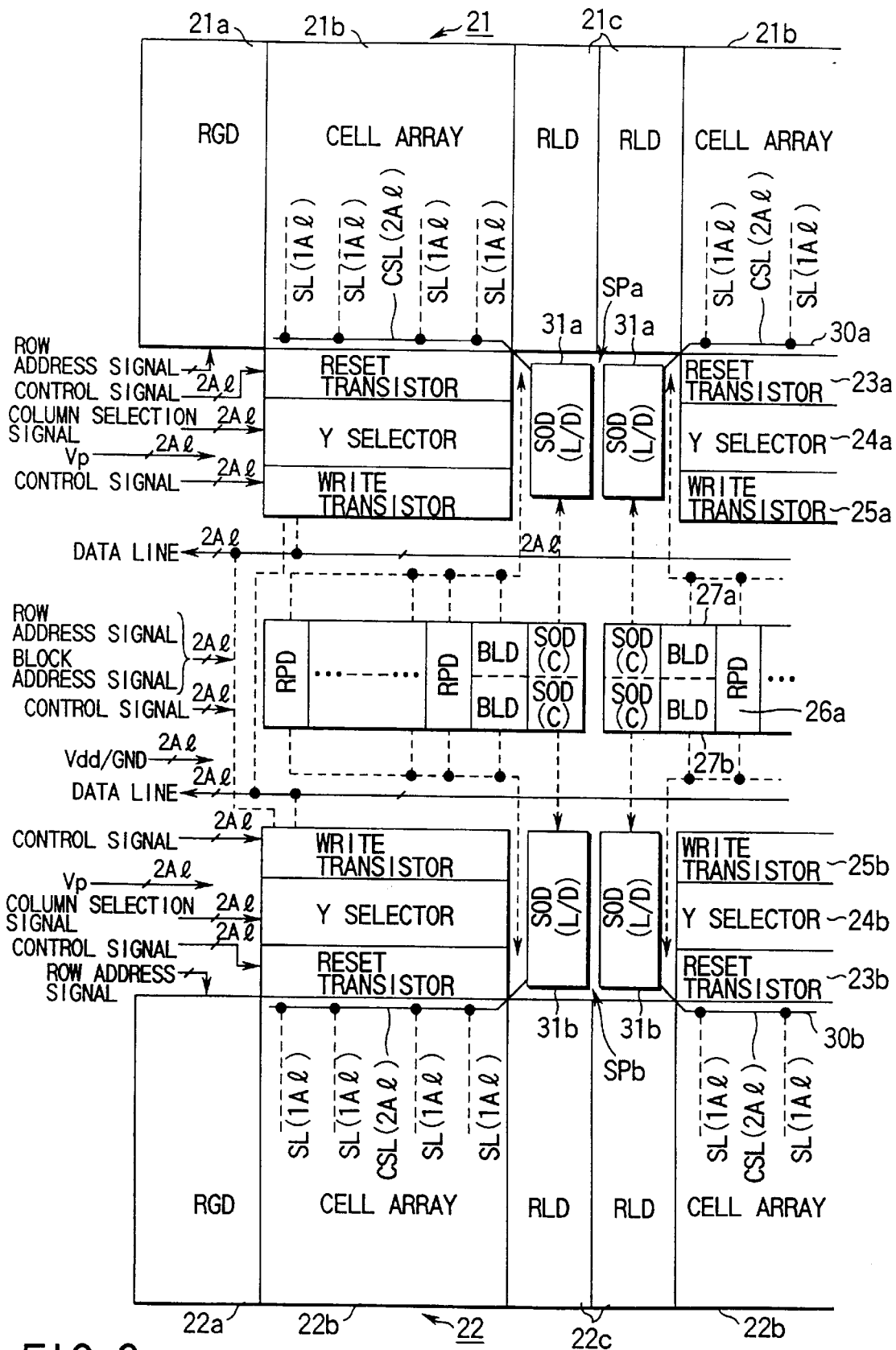
FIG. 3 is a circuit diagram showing the third embodiment of the present invention.

FIG. 3 shows the third embodiment of the present invention. The same reference numerals as in the second embodiment denote the same parts in the third embodiment, and a detailed description thereof will be omitted.

In this embodiment, a source decoder (SDO (L/D)) 31*a* is located in an area SPa formed by a row local decoder 21*c*, a reset transistor 23*a*, a Y selector 24*a*, and a write transistor 25*a*. A source decoder (SOD (L/D)) 31*b* is disposed in an area SPb formed by a row local decoder 22*c*, a reset transistor 23*b*, a Y selector 24*b*, and a write transistor 25*b*.

Each of the source decoders (SOD (L/D)) 31*a* and 31*b* is constituted by a large-size transistor. Therefore, when these circuits are arranged in the areas SPa and SPb, the space in the core portion can be more effectively and efficiently utilized.

Figure 4:
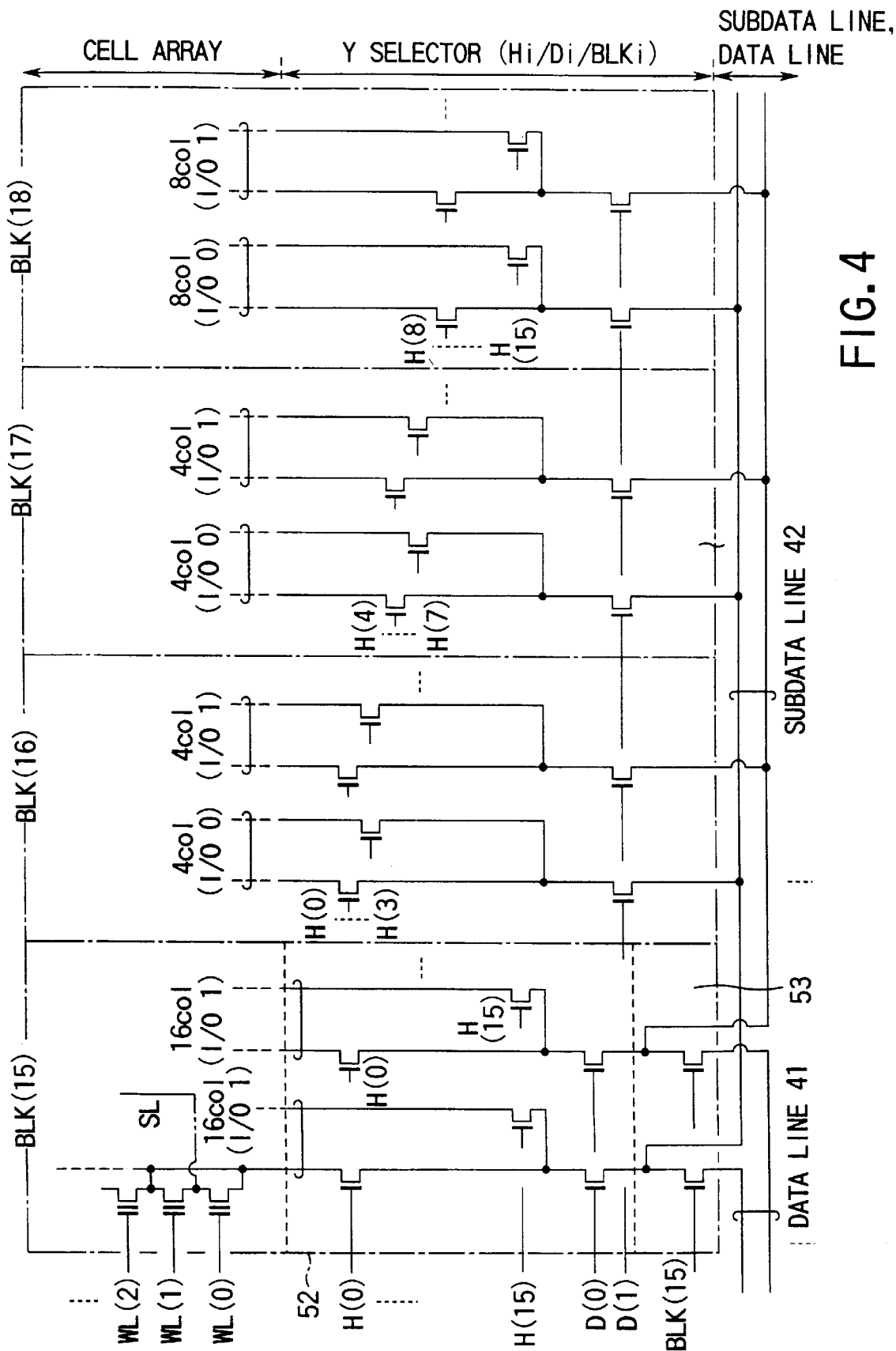
FIG. 4 is a circuit diagram showing the fourth embodiment of the present invention.
Figure 5:
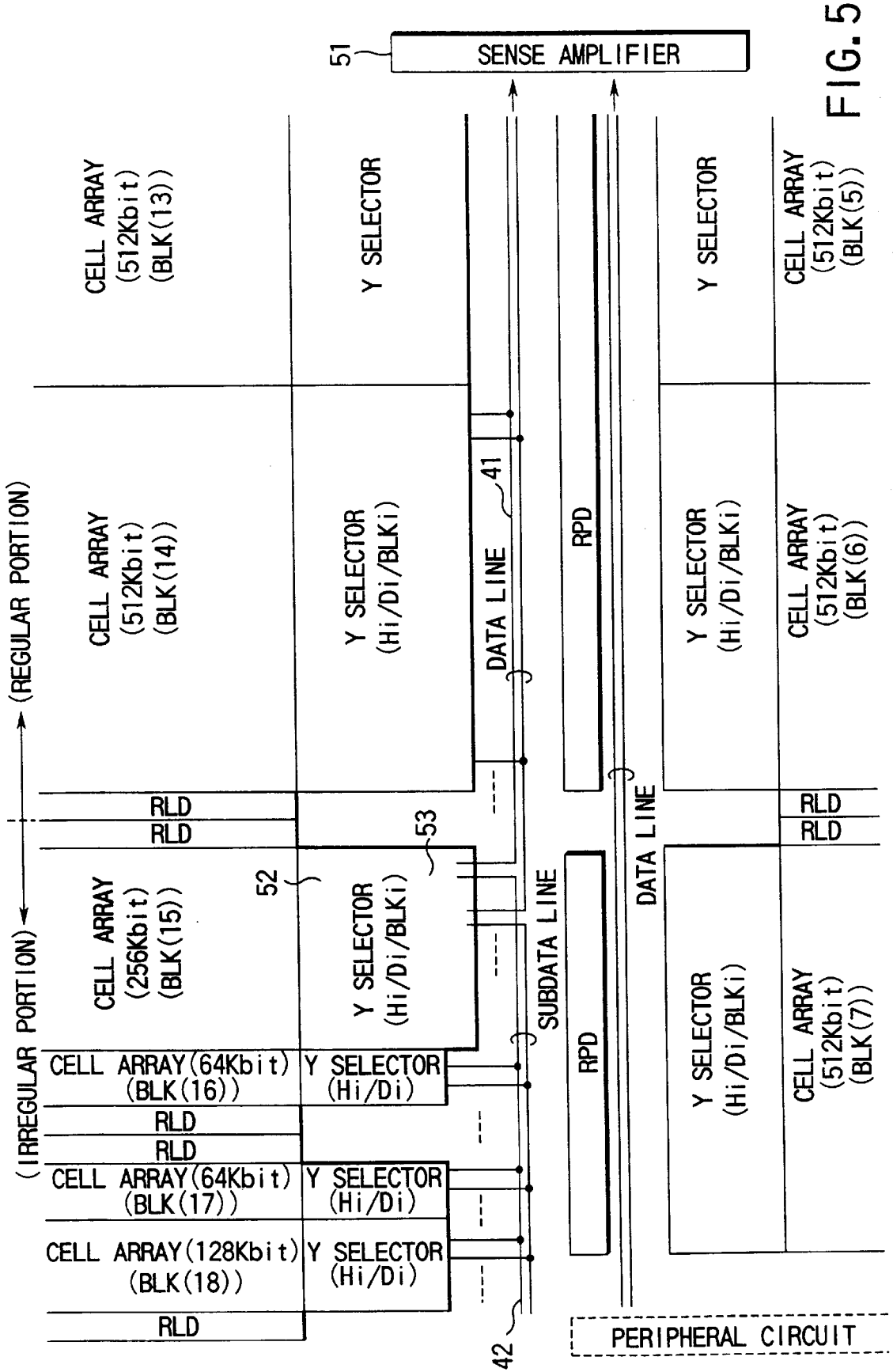
FIG. 5 is a circuit diagram showing the fifth embodiment of the present invention.

FIGS. 4 and 5 show the layout of a core portion corresponding to an irregular block. The block arrangement shown in FIG. 4 is reverse to that in FIG. 5. This embodiment eliminates the increase in layout area, due to the subdata lines inserted between the column selection signal Hi and Di selector and the BLKi selector in the conventional irregular block shown in FIG. 13, by dividing the subdata lines into data lines and subdata lines. In FIG. 4, data lines 41 extend along an irregular block BLK (15), and subdata lines 42 extend on the extended lines of the data lines 41 along irregular blocks BLK (15), BLK (16), BLK (17), and BLK (18).

Figure 14:
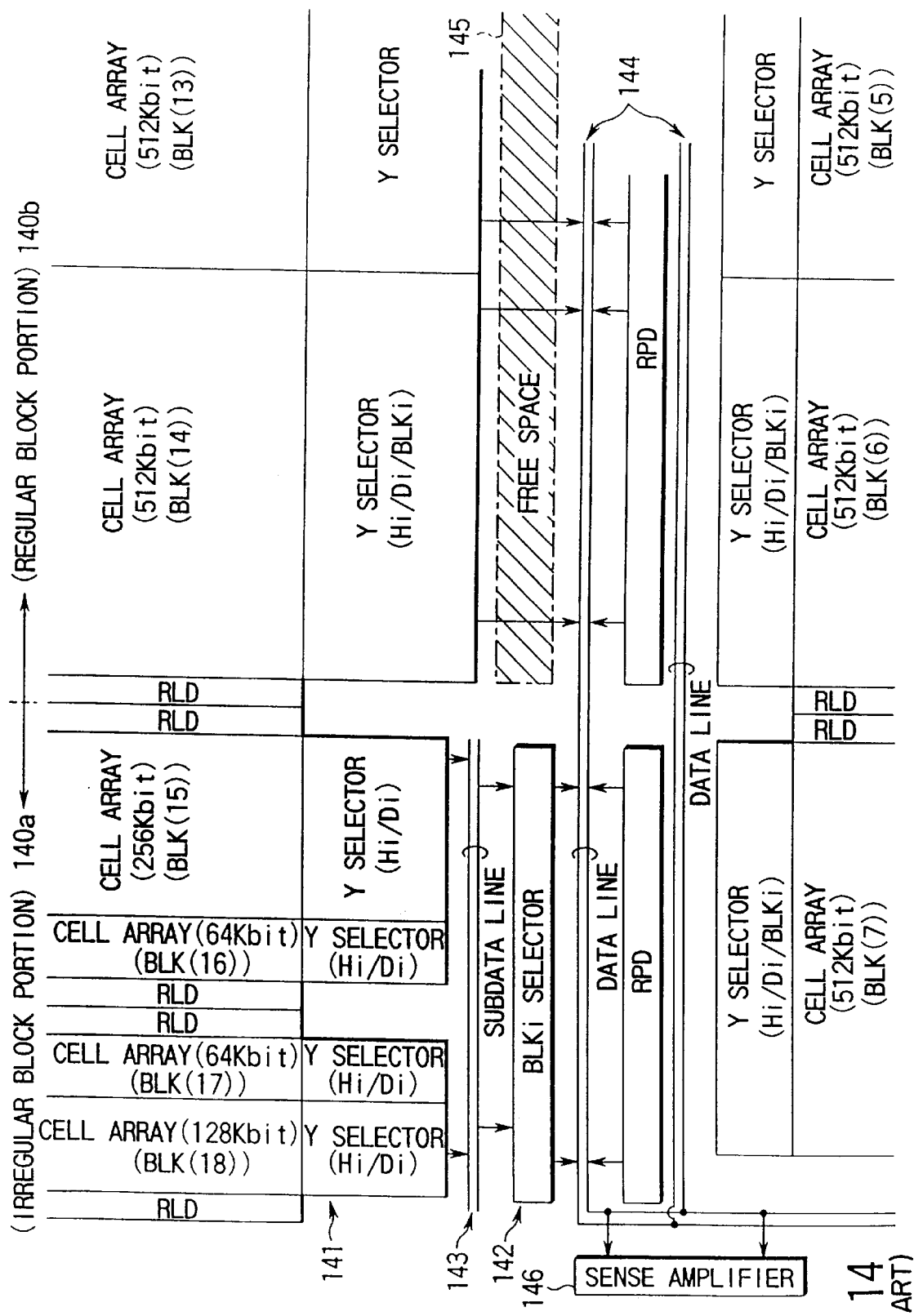
FIG. 14 is a circuit diagram showing the layout of the conventional semiconductor memory device.
Figure 15:
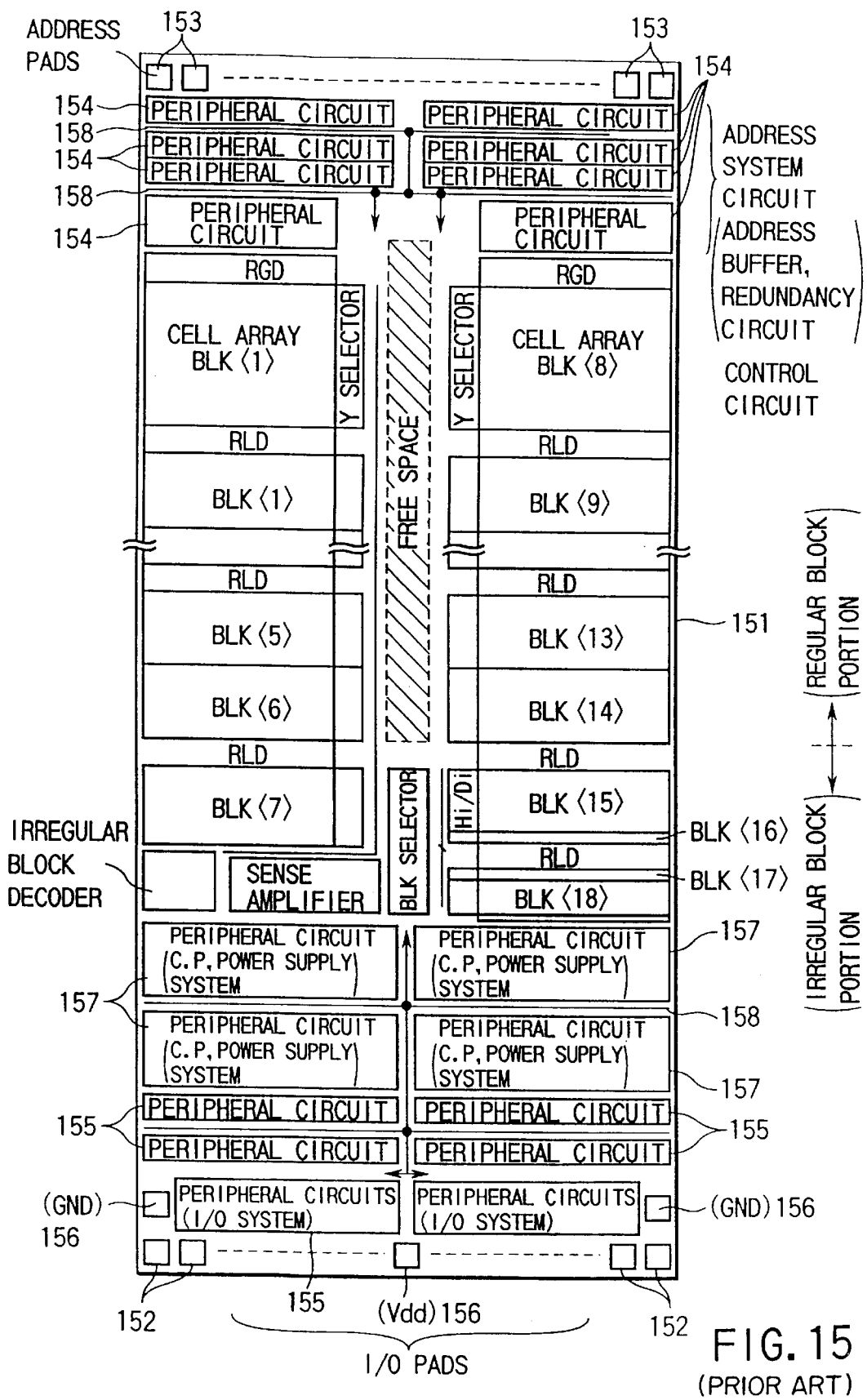
FIG. 15 is a circuit diagram showing the layout of the conventional semiconductor memory device.

In the prior art shown in FIG. 14, since irregular blocks BLK (15) to BLK (18) are located at the core portion close to a sense amplifier 146, the subdata lines 143 and data lines 144 overlap to increase the layout area.

By contrast, in this embodiment, the irregular blocks BLK (15) to BLK (18) are disposed at the farthest position from a sense amplifier 51. The irregular blocks are adjacent to each other. A Y selector 52 of the irregular block BLK (15) closest to the sense amplifier 51 has a block selector (BLKi) 53. The data lines 41 and subdata lines 42 are extracted from the Y selector 52 through the block selector 53.

Only the subdata lines 42 are connected to the cell arrays of the remaining irregular blocks BLK (16) to BLK (18) through Y selectors (Hi/Di selectors).

Figure 13:
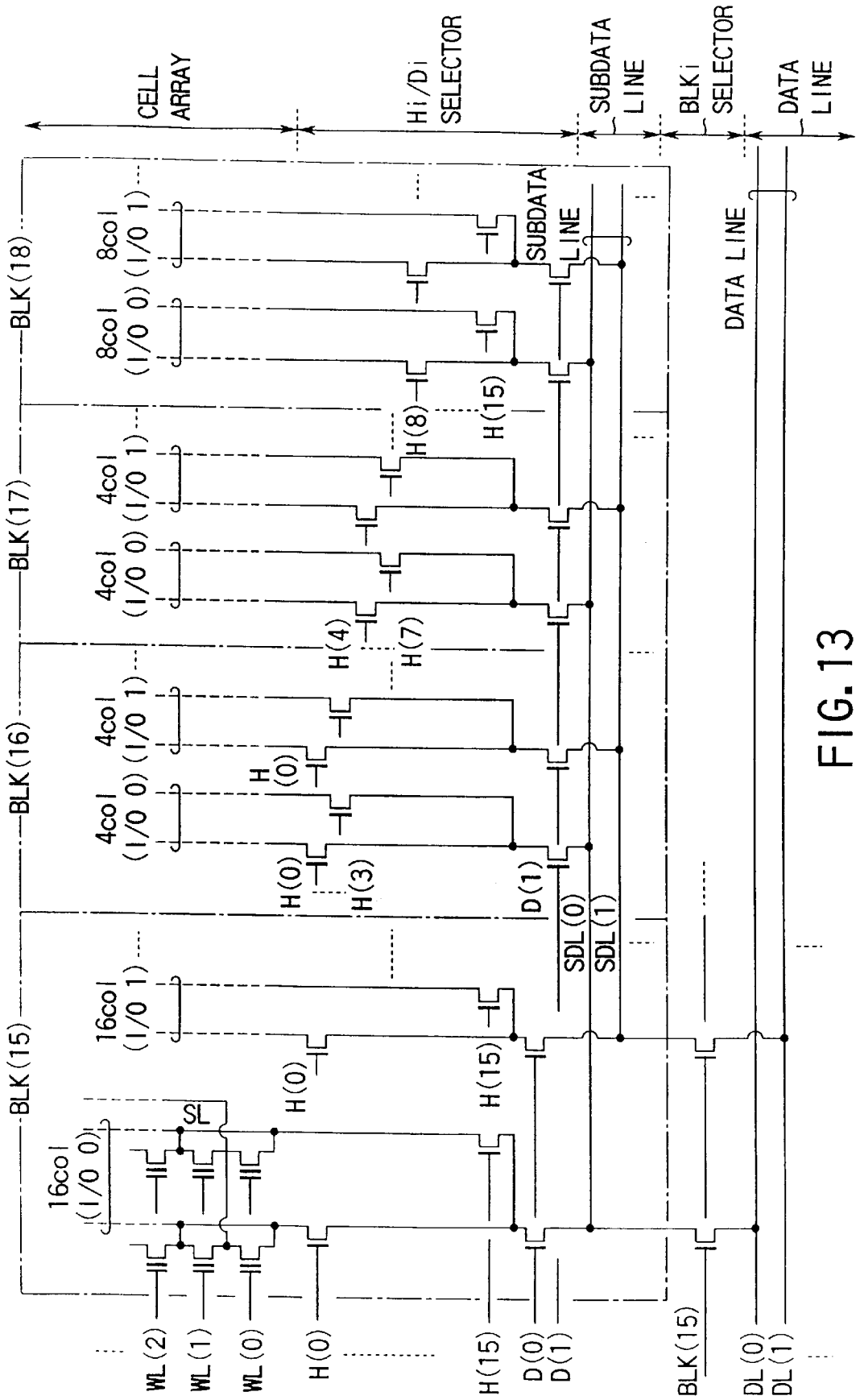
FIG. 13 is a circuit diagram showing the layout of the conventional semiconductor memory device.

As shown in FIGS. 4 and 5, the subdata lines 42 extend on the extended lines of the data lines 41, so the subdata lines 42 and data lines 41 are not parallel, unlike FIGS. 13 and 14. Therefore, the wasteful free space can be prevented, and the chip area can be reduced, unlike the prior art.

Figure 6:
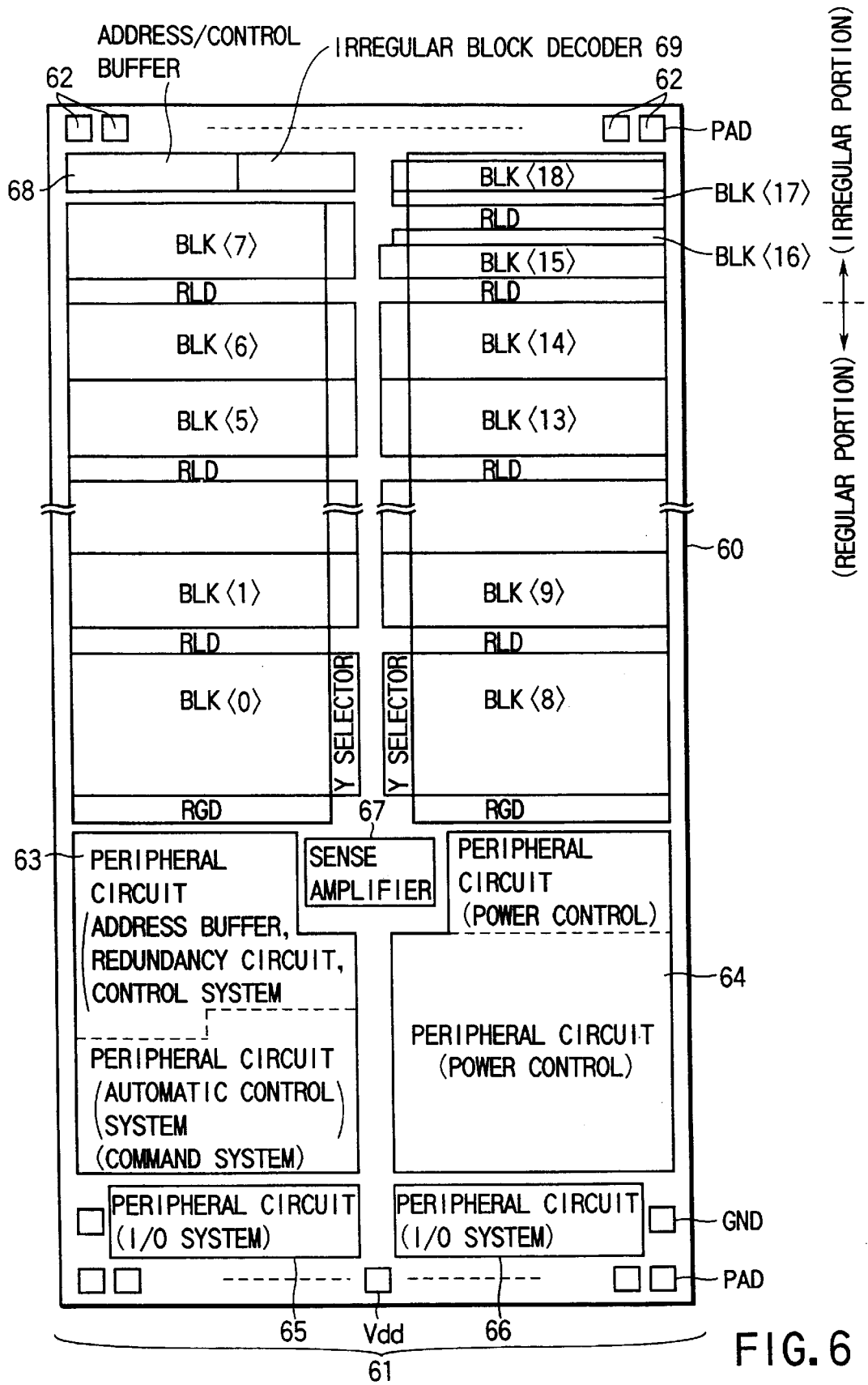
FIG. 6 is a circuit diagram showing the sixth embodiment of the present invention.
Figure 7:
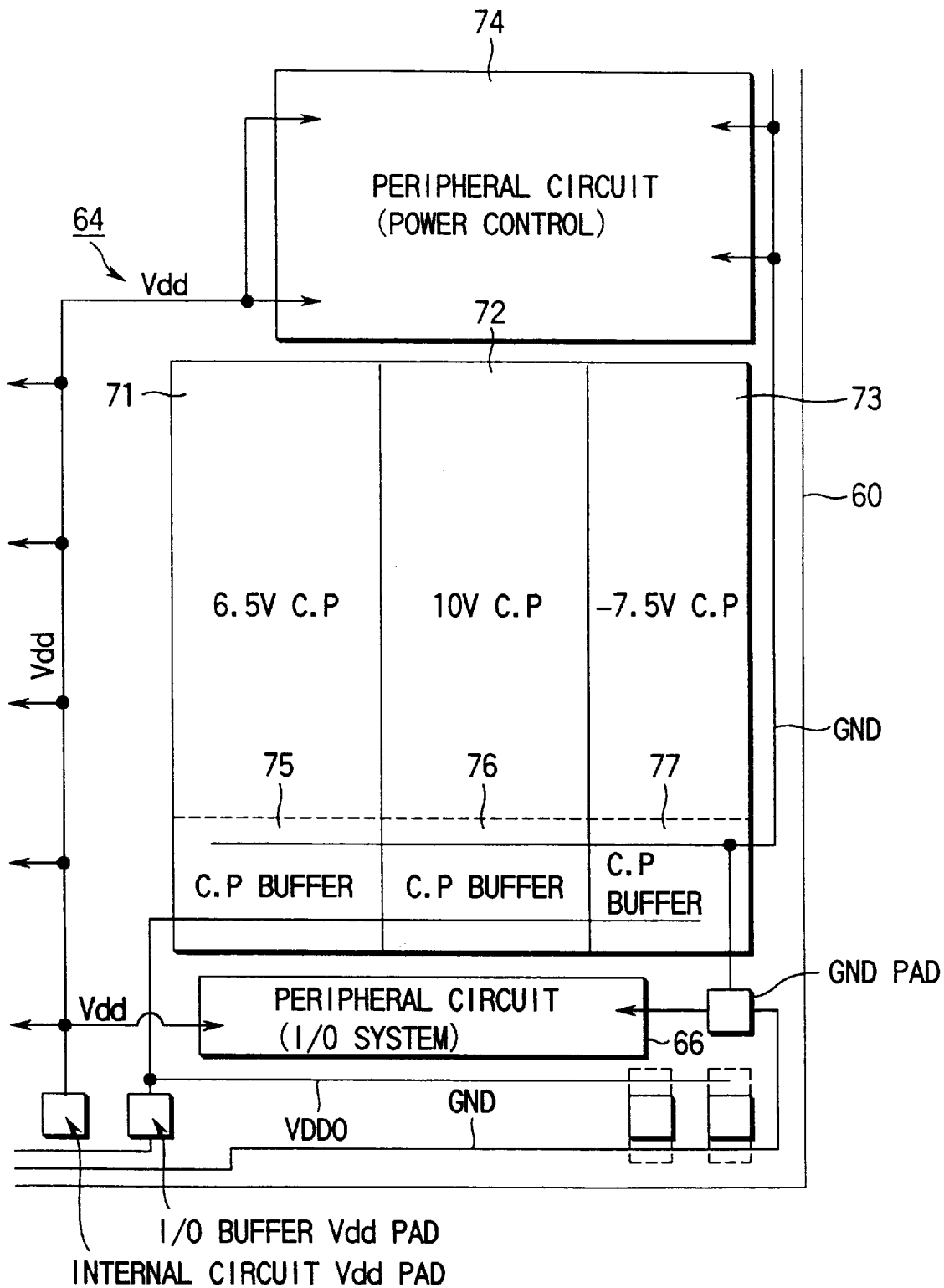
FIG. 7 is an enlarged view showing part of FIG. 6.

FIGS. 6 and 7 show the fifth embodiment of the present invention. This embodiment allows efficient layout of peripheral circuits by grouping the peripheral circuits at a single position, which are conventionally scattered to peripheral portions of the chip.

In FIG. 6, a plurality of I/O pads 61 used to input/output data are formed at one end portion along the longitudinal direction of a chip 60. A plurality of I/O pads 62 for receiving address signals or control signals are formed at the other end portion along the longitudinal direction. Peripheral circuits 63, 64, 65, and 66, a sense amplifier 67, various decoders, and cell arrays are interposed between the pads 61 and 62. The peripheral circuits 63 to 66 to be concentrated on one portion are laid out near the I/O pads 61. A peripheral circuit 68 including minimum circuits such as an input-side buffer circuit or output-side buffer circuit, and an address control circuit, and if the core portion has an irregular block, an irregular block decoder 69 are laid out near the I/O pads 62 far from the I/O pads 61. The peripheral circuit 68 and decoder 69 are arranged in the free space generated due to the layout of the I/O pads 62 and regular block, so the increase in chip area is minimized.

Most signals transmitted between the peripheral circuit 68 and the peripheral circuits 63 to 66 which are concentrated are input/output signals and control signals, so the number of signal lines arranged between the two ends along the longitudinal direction of the chip can be reduced.

In the area where the peripheral circuits are concentrated, the sense amplifier 67 is adjacent to the core portion, and the peripheral circuits 65 and 66 including the input/output buffer circuits (I/O control circuits) of the I/O system are adjacent to the I/O pads 61. The remaining circuits are divided into two groups. More specifically, an address signal controller, a redundancy circuit, control system circuits, automatic control system circuits, and command system circuits are formed into a first group in the peripheral circuit 63. Charge pump (C.P) circuits and power supply circuits such as a power control circuit are formed into a second group in the circuit 64.

Each of the peripheral circuits 63 and 64 is laid out in a pattern to close as a square as possible. One side of each of the peripheral circuits 63 and 64 substantially has a length obtained by dividing the side of the chip 60 where the I/O pads 61 are formed into two parts. That is, the sum of the layout width of the peripheral circuit 64 of the power supply system and that of the peripheral circuit 63 roughly equals the length of the side of the chip where the I/O pads 61 are formed.

In the peripheral circuit 63, the signal interconnections between the circuits and blocks are minimized, and the power supply interconnection is shortened to decrease the capacitance and resistance components, thereby preventing noise. Since the area is nearly square, a margin is generated in the two-dimensional direction, unlike the rectangular peripheral circuit. This provides a certain degree of freedom in block arrangement. When multistage circuits such as charge pump circuits are concentrated, an optimum layout corresponding to the characteristics of the circuits is enabled. In addition, the signal or power supply interconnections can be made short to reduce the layout area.

FIG. 7 shows an example of the peripheral circuit 64, and in this case, details of the layout of the power supply system. The power supply interconnection for preventing noise will be described with reference to FIG. 7.

The peripheral circuit 64 has a plurality of charge pump circuits 71, 72, and 73 for generating a voltage and a peripheral circuit 74 for controlling the power supply, which are necessary for the operation of the flash EEPROM. C.P buffers 75, 76, and 77 as buffer circuits for driving capacitors constituting the charge pump circuits are connected to the charge pump circuits 71, 72, and 73, respectively.

In the circuit of the power supply system, a particularly large noise generation source during operation is the C.P buffer for driving the capacitor of the charge pump circuit. In this embodiment, the C.P buffers 75, 76, and 77 are arranged on the I/O pad 61 side with respect to the charge pump circuits 71, 72, and 73 to supply a potential Vdd from the I/O buffer Vdd pad to the C.P buffers 75, 76, and 77. The potential Vdd is supplied to the remaining circuits and the peripheral circuit 74 from an internal potential Vdd pad. In this way, the charge pump circuits and the remaining circuits are driven with potentials supplied from different pads, so the remaining circuits are not affected by noise due to the current for driving the capacitors.

In addition, the peripheral circuit 64 is substantially square, and the charge pump circuits 71, 72, and 73 are aligned in the direction of arrangement of the I/O pads 61. Therefore, the power supply interconnection can be shared by the three C.P buffers 75, 76, and 77, and the interconnection space can be reduced.

Figure 8:
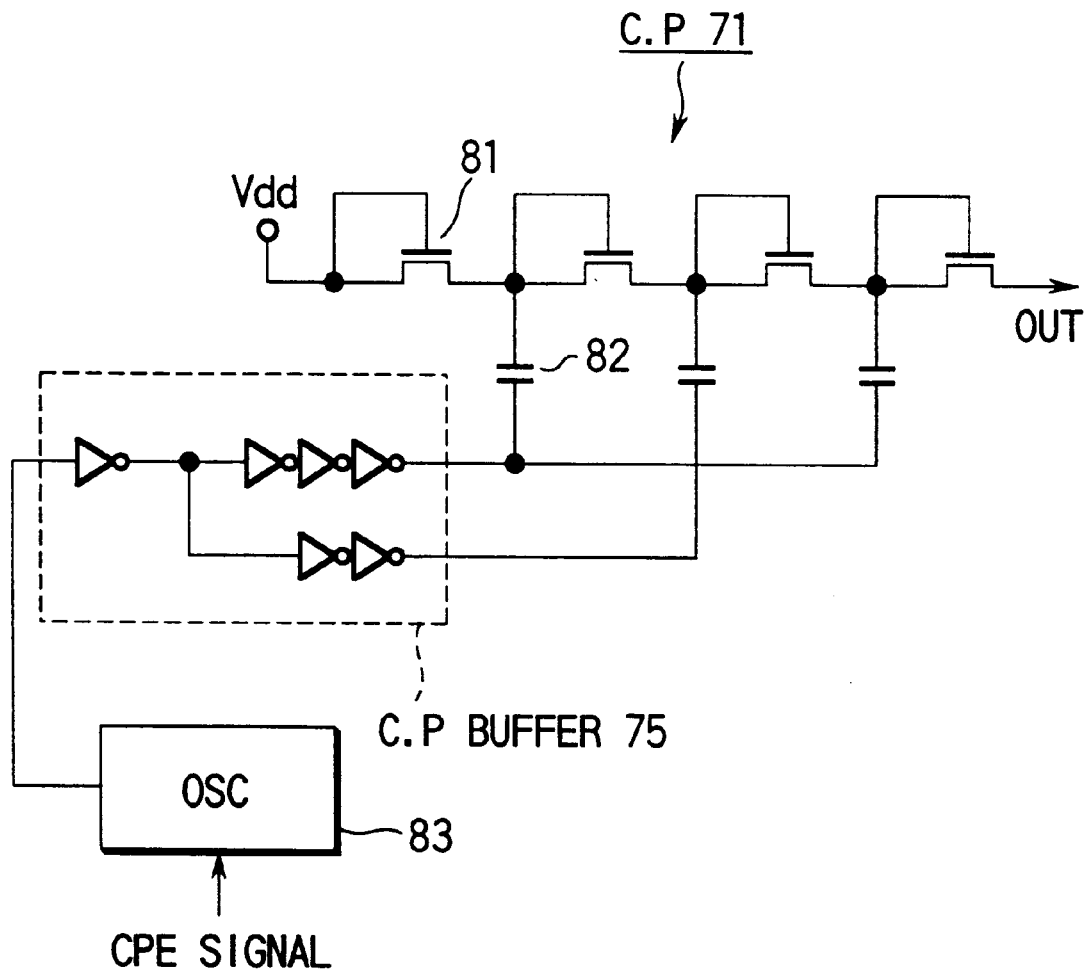
FIG. 8 is a circuit diagram showing part of FIG. 7.
Figure 9:
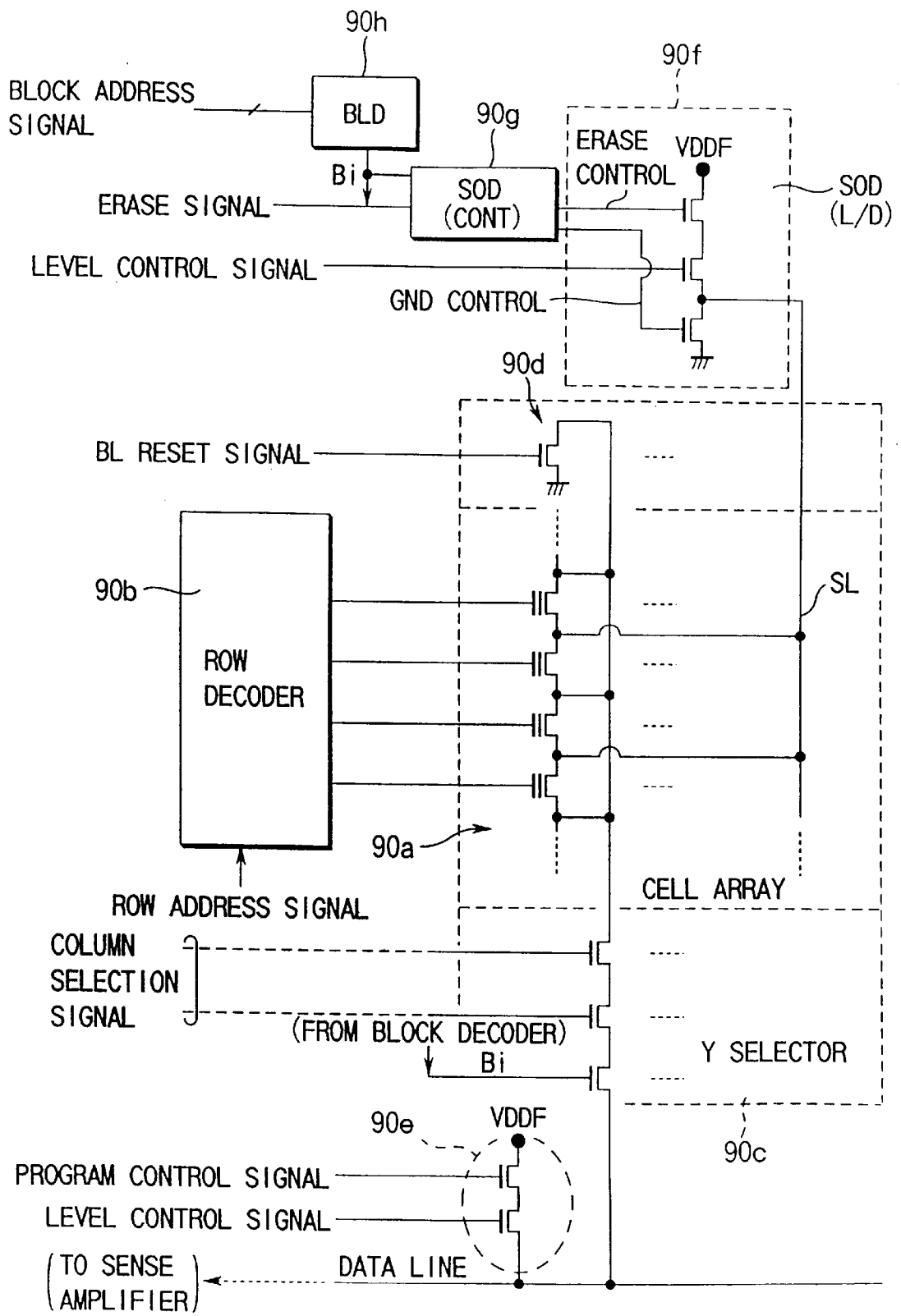
FIG. 9 is a circuit diagram showing a conventional semiconductor memory device.
Figure 10:
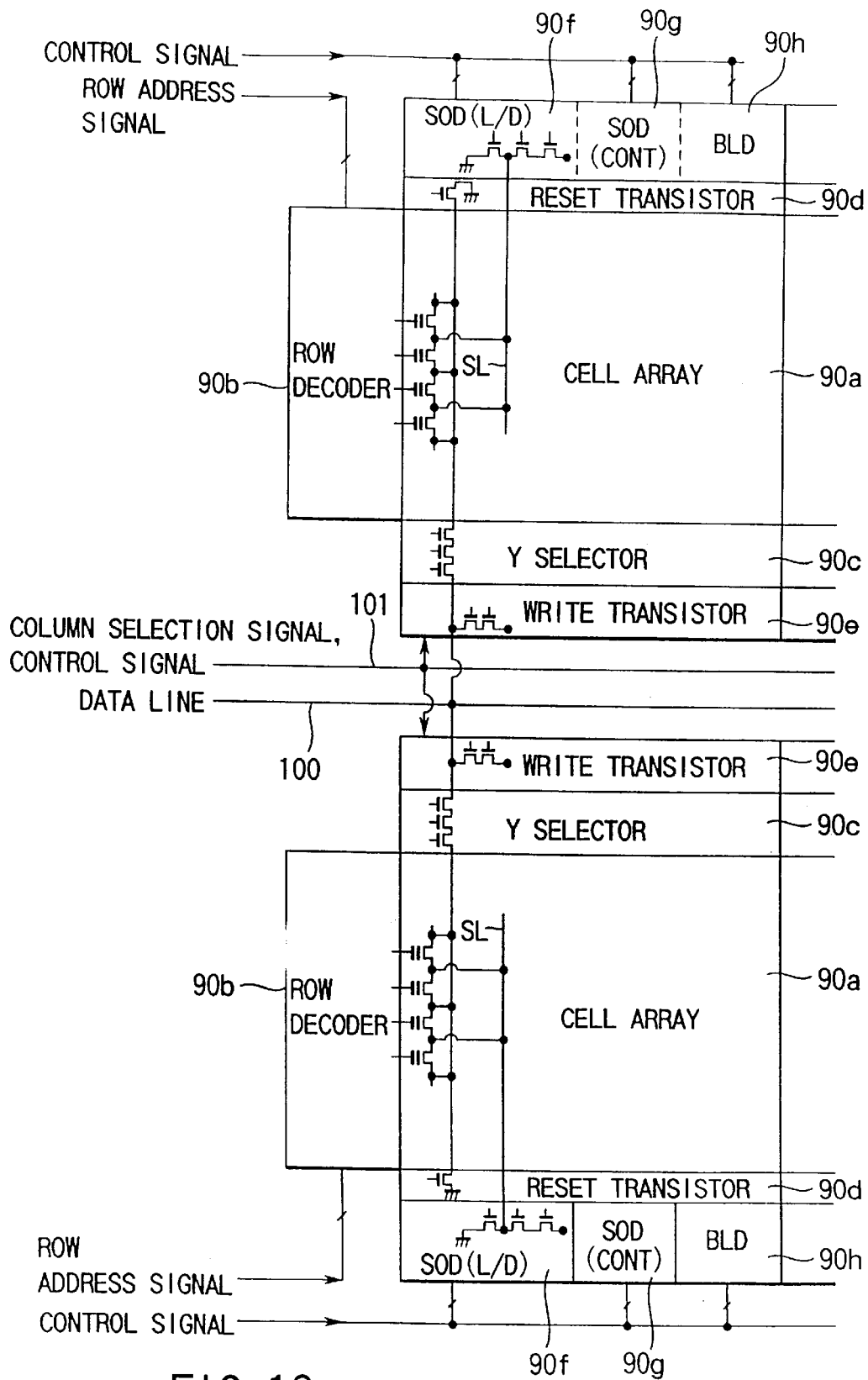
FIG. 10 is a circuit diagram showing the layout of the conventional semiconductor memory device.
Figure 11:
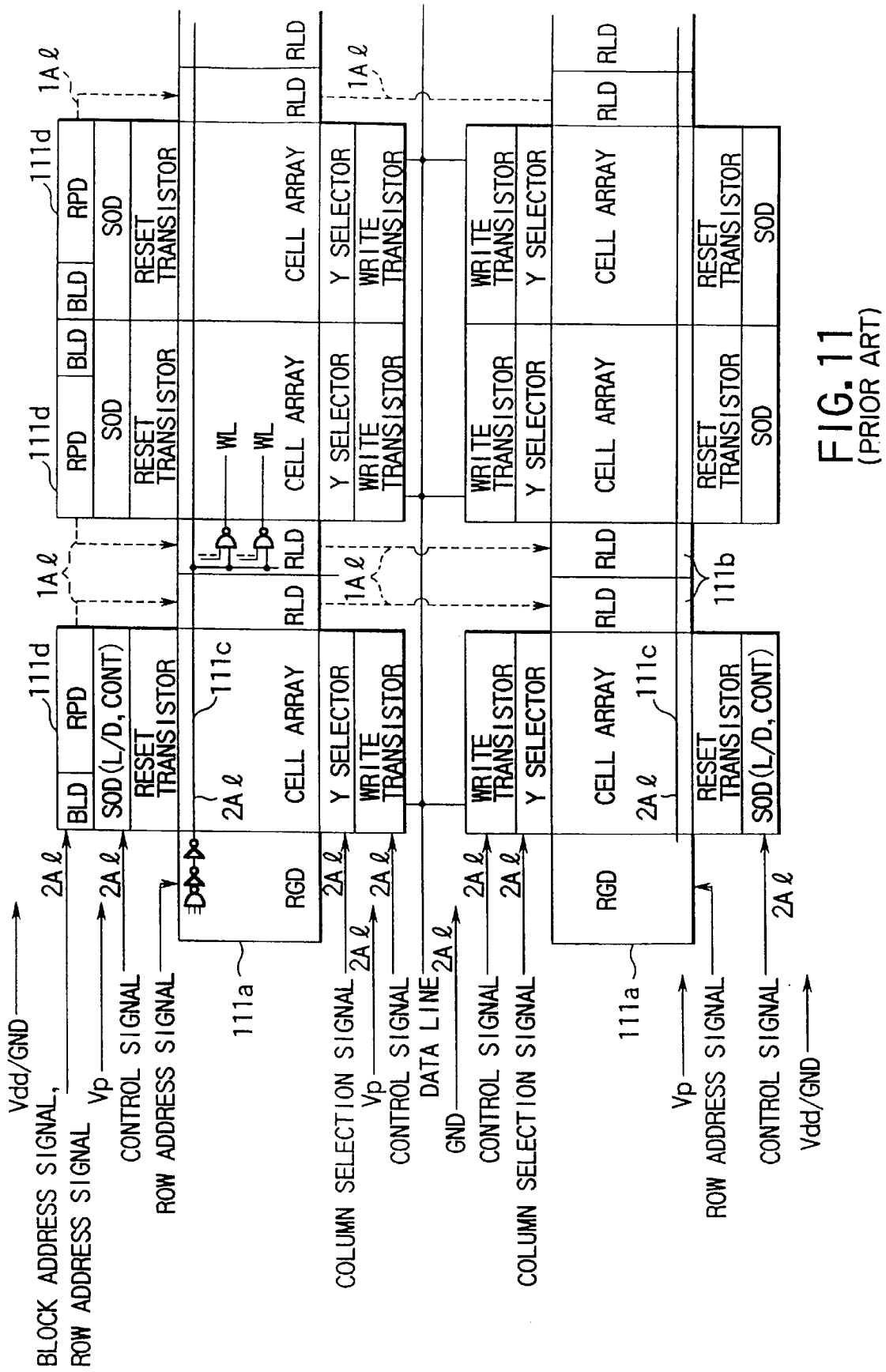
FIG. 11 is a circuit diagram showing the layout of the conventional semiconductor memory device.
Figure 12:
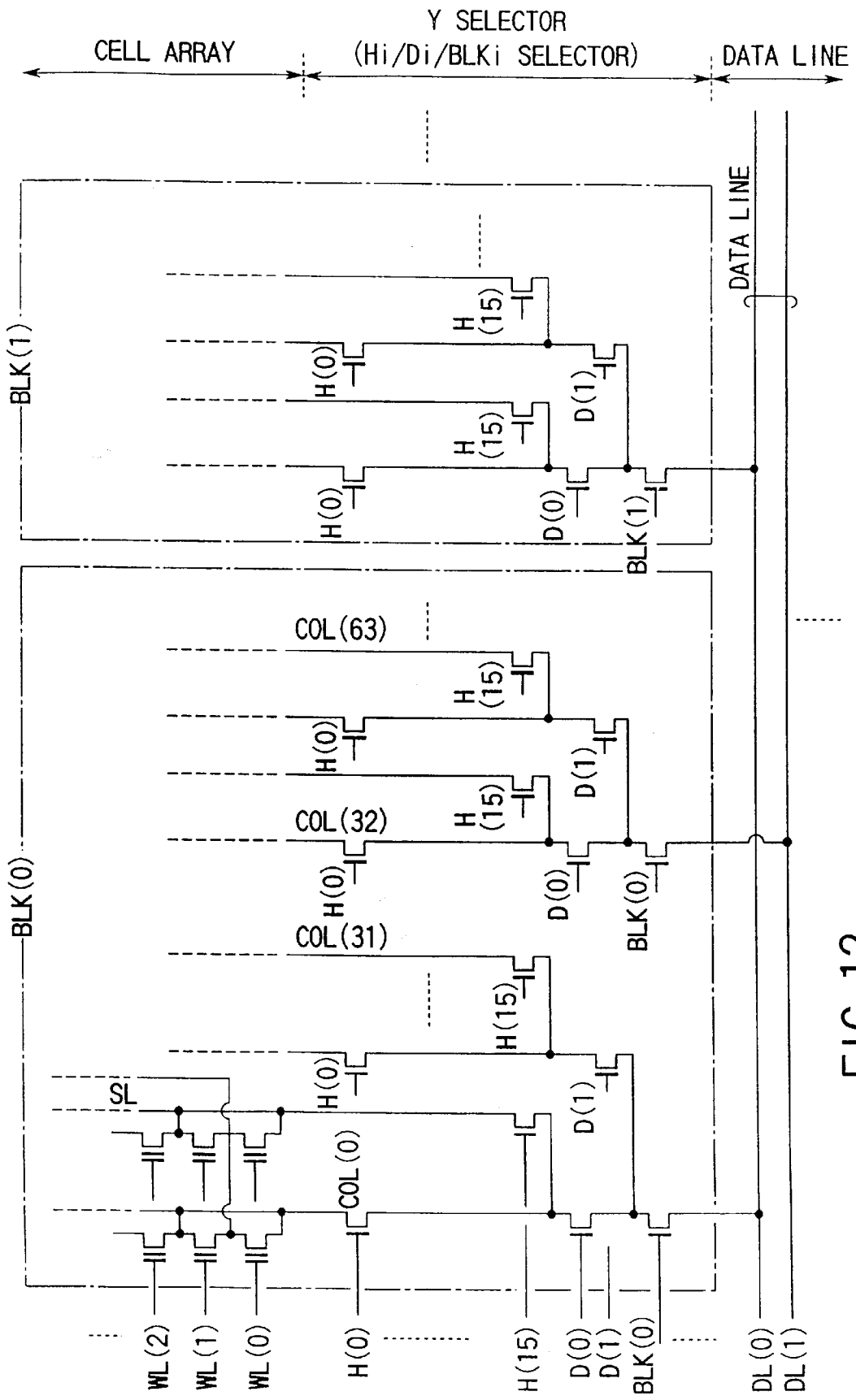
FIG. 12 is a circuit diagram showing the layout of the conventional semiconductor memory device.

FIG. 8 shows an example of the charge pump circuit 71. In the charge pump circuit 71, a plurality of diode-connected transistors 81 are connected in series between the power supply and the output node. One terminal of a capacitor 82 is connected to the connection node of each transistor. The C.P buffer 75 supplies the output signal-from an oscillator (OSC) 83 to the other terminal of each capacitor 82.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a core portion including a cell array, comprising:
   a first cell array group arranged in said core portion and including a plurality of cell arrays and a row decoder;
   a second cell array group arranged substantially parallel to said first cell array group and including a plurality of cell arrays and a row decoder; and
   circuit blocks laid out in an area between said first and second cell array groups, wherein said circuit blocks include a reset transistor for resetting bit lines of said cell array, a Y-selector for selecting said bit lines, and a write transistor for applying a high voltage to said bit lines of memory cells in a write operation, and wherein said reset transistor, said Y selector, and said write transistor are respectively laid out from a side adjacent to said cell array.

2. A device according to claim 1, wherein said circuit blocks further include a block decoder for selecting said cell array, and a source decoder for supplying a source potential to each memory cell through source lines, and wherein said block decoder and said source decoder are laid out in an area farther from said cell array than said write transistor.

3. A device according to claim 2, wherein
   said source lines in said cell array are connected to each other through a second level metal interconnection, and an output terminal of said source decoder is connected to said second level interconnection through a first level metal interconnection.

4. A device according to claim 1, wherein
   a power is supplied to said first and second cell array groups and said circuit blocks through a second level metal interconnection.

5. A semiconductor memory device based on a double word line scheme, comprising:
   a first cell array group including a plurality of cell arrays, a row local decoder for selecting word lines of said cell arrays, and a row global decoder for selecting said row local decoder;
   a second cell array group including a plurality of cell arrays, a row local decoder for selecting word lines of said cell arrays, and a row global decoder for selecting said row local decoder; and
   circuit blocks laid out in an area between said first and second cell array groups and including a row partial decoder for outputting a selection signal to be supplied to said row local decoder.

6. A device according to claim 5, wherein said circuit blocks include a reset transistor for resetting bit lines of said cell array, a Y-selector for selecting said bit lines, and a write transistor for applying a high voltage to said bit lines of memory cells in a write operation, and said reset transistor, said Y selector, and said write transistor are respectively laid out from a side adjacent to said cell array.

7. A device according to claim 6, wherein said circuit blocks further include a block decoder for selecting said cell array, and a source decoder for supplying a source potential to each memory cell through source lines, and wherein said block decoder, said source decoder and said row partial decoder are laid out in an area farther from said cell array than said write transistor.

8. A device according to claim 7, wherein
   said source lines in said cell array are connected to each other through a second level metal interconnection, and an output terminal of said source decoder is connected to said second level interconnection through a first level metal interconnection.

9. A device according to claim 6, wherein said circuit blocks further include a block decoder for selecting said cell array, and a source decoder for supplying a source potential to each memory cell through source lines, and wherein said block decoder, said row partial decoder, and a control circuit of said source decoder are laid out in an area farther from said cell array than said write transistor, and a load/driver circuit of said source decoder is laid out in an area near said row local decoder.

10. A device according to claim 5, wherein
    a power is supplied to said first and second cell array groups and said circuit blocks through a second level metal interconnection.

11. A semiconductor memory device comprising:
    a first cell array having large regular blocks;
    a second cell array having irregular blocks each smaller than said regular block;
    a Y selector constituted by a block selector for selecting blocks of said first and second cell arrays and a column selector for selecting columns in said blocks;
    data lines extending along said regular blocks and adapted to connect columns selected by said Y selector to a sense amplifier; and
    subdata lines arranged on extended lines of said data lines along said irregular blocks, connected to said selected columns through said column selector, and connected to said data lines through said block selector;
    wherein said regular blocks are laid out near said sense amplifier, and said irregular blocks are arranged in a distant area from said sense amplifier.

12. A device according to claim 11, wherein
    among said plurality of irregular blocks, an irregular block closest to said sense amplifier has a column selector and a block selector, and each of said remaining irregular blocks has only a column selector.

13. A device according to claim 11, wherein said data lines extended from a regular block side are input to a block selector of an irregular block closest to said sense amplifier and terminated, and said subdata lines as output from said block selector are connected to a column selector of said irregular block, extending to a remaining irregular block side, and connected to column selectors of the remaining irregular blocks.

* * * * *